(12) United States Patent
Zhu et al.

(10) Patent No.: US 12,713,652 B2
(45) Date of Patent: Aug. 18, 2026

(54) SEMICONDUCTOR DEVICE, METHOD OF MANUFACTURING THE SEMICONDUCTOR DEVICE, AND ELECTRONIC APPARATUS INCLUDING THE SEMICONDUCTOR DEVICE

(71) Applicant: INSTITUTE OF MICROELECTRONICS, CHINESE ACADEMY OF SCIENCES, Beijing (CN)

(72) Inventors: Huilong Zhu, Poughkeepsie, NY (US); Chen Li, Beijing (CN); Yongkui Zhang, Beijing (CN)

(73) Assignee: Institute of Microelectronics, Chinese Academy of Sciences, Beijing (CN)

(*) Notice: Subject to any disclaimer, the term of this patent is extended or adjusted under 35 U.S.C. 154(b) by 582 days.

(21) Appl. No.: 17/427,539

(22) PCT Filed: Apr. 24, 2019

(86) PCT No.: PCT/CN2019/084135
§ 371 (c)(1),
(2) Date: Jul. 30, 2021

(87) PCT Pub. No.: WO2020/155432
PCT Pub. Date: Aug. 6, 2020

(65) Prior Publication Data

US 2022/0102559 A1 Mar. 31, 2022

(30) Foreign Application Priority Data

Feb. 3, 2019 (CN) ......................... 201910108871.8

(51) Int. Cl.
*H10D 30/67* (2025.01)
*H10D 30/01* (2025.01)
(Continued)

(52) U.S. Cl.
CPC ....... *H10D 30/6728* (2025.01); *H10D 30/031* (2025.01); *H10D 30/6735* (2025.01); *H10D 64/017* (2025.01); *H10D 64/252* (2025.01)

(58) Field of Classification Search
CPC ......... H01L 29/78642; H01L 29/42392; H01L 29/0676; H01L 29/42376; H10D 64/252;
(Continued)

(56) References Cited

U.S. PATENT DOCUMENTS 7,982,247 B2 * 7/2011 Riviere-Cazaux ... H10D 64/519 257/E29.2
9,646,975 B2 * 5/2017 Peri ........................ H10B 43/27
(Continued)

FOREIGN PATENT DOCUMENTS

CN 101447552 A 6/2009
CN 102124548 A 7/2011
(Continued)

*Primary Examiner* — Chad M Dicke
*Assistant Examiner* — Mario Andres Autore, Jr.
(74) *Attorney, Agent, or Firm* — Christensen, Fonder, Dardi & Busse PLLC; John P. Fonder

(57) ABSTRACT

Disclosed are a semiconductor device, a method of manufacturing the semiconductor device, and an electronic apparatus including the semiconductor device. The semiconductor device may include: a substrate; an active region extending vertically on the substrate, wherein the active region includes a first source/drain layer, a channel layer and a second source/drain layer that are sequentially stacked; a gate stack formed around at least part of an outer peripheral sidewall of the channel layer. A sidewall of the gate stack close to the channel layer is aligned with the outer peripheral sidewall of the channel layer, so as to occupy substantially a same range in a vertical direction, and a part of the gate stack close to the channel layer has a shape that gradually tapers as getting close to the channel layer.

17 Claims, 8 Drawing Sheets

(51) Int. Cl.
*H10D 64/01* (2025.01)
*H10D 64/23* (2025.01)

(58) Field of Classification Search
CPC ............. H10D 64/256; H10D 64/2527; H10D 12/461; H10D 12/481; H10D 30/01; H10D 30/014; H10D 30/0241; H10D 30/031; H10D 30/0321; H10D 30/0323; H10D 30/0327; H10D 30/6728–673; H10D 64/518; H10D 30/67–673; H10D 30/63; H10D 30/025
See application file for complete search history.

(56) References Cited

U.S. PATENT DOCUMENTS 9,812,443 B1 11/2017 Cheng et al.
10,014,372 B1 * 7/2018 Leobandung ...... H10D 30/6735
10,115,897 B1 * 10/2018 Sato ..................... H10N 70/823
11,271,108 B2 * 3/2022 Hekmatshoartabari ...................... H10D 62/117
2001/0041438 A1 * 11/2001 Maeda ................ H01L 27/1203 438/622
2004/0217430 A1 * 11/2004 Chu .................... H01L 29/1054 257/E29.253
2004/0262681 A1 * 12/2004 Masuoka ............. H10D 30/673 257/E21.415
2007/0246783 A1 * 10/2007 Moon .................. H10D 62/292 257/E21.627
2008/0197381 A1 * 8/2008 Kawashima ...... H01L 29/66348 257/E21.384
2010/0264484 A1 * 10/2010 Masuoka .......... H01L 29/78642 257/E27.06
2017/0162446 A1 * 6/2017 Balakrishnan ......... H10D 84/83
2017/0243869 A1 * 8/2017 Chang ................... H01L 29/517
2017/0243879 A1 * 8/2017 Yu .......................... H10B 43/27
2017/0278951 A1 * 9/2017 Balakrishnan .... H01L 29/66666
2017/0330958 A1 * 11/2017 Coquand .............. H10D 62/822
2017/0352669 A1 * 12/2017 Sharangpani .......... H10B 41/40
2018/0006024 A1 * 1/2018 Anderson ........... H01L 29/1037
2018/0097106 A1 * 4/2018 Zhu .................... H10D 84/0195
2018/0182782 A1 * 6/2018 Zhou .................. H10D 30/0316
2018/0261695 A1 * 9/2018 Masuoka .............. H01L 21/475
2019/0157426 A1 * 5/2019 Masuoka .............. H01L 27/092
2019/0251354 A1 * 8/2019 Cork .................... A61B 1/0004
2019/0305085 A1 * 10/2019 Sung ........................ H01L 29/36
2019/0393343 A1 * 12/2019 Reznicek .......... H01L 21/30604
2020/0052094 A1 * 2/2020 Mochizuki ............. H10D 30/63
2020/0075761 A1 * 3/2020 Joseph ................. H10D 84/038
2020/0357795 A1 * 11/2020 Zhu ...................... H10D 64/252
2021/0043762 A1 * 2/2021 Zhu ...................... H10D 64/252
2021/0226069 A1 * 7/2021 Zhu ...................... H10D 62/122
2021/0280700 A1 * 9/2021 Wernersson ........... H10D 30/43

FOREIGN PATENT DOCUMENTS

CN 102263200 A 11/2011
EP 0187237 A2 * 7/1986
JP H07-245395 A 9/1995

* cited by examiner

SEMICONDUCTOR DEVICE, METHOD OF MANUFACTURING THE SEMICONDUCTOR DEVICE, AND ELECTRONIC APPARATUS INCLUDING THE SEMICONDUCTOR DEVICE

CROSS REFERENCE TO RELATED APPLICATION(S)

This application is a Section 371 National Stage Application of International Application No. PCT/CN2019/084135 filed on Apr. 24, 2019, which claims priority to Chinese Patent Application No. 201910108871.8 entitled “SEMICONDUCTOR DEVICE, METHOD OF MANUFACTURING THE SEMICONDUCTOR DEVICE, AND ELECTRONIC APPARATUS INCLUDING THE SEMICONDUCTOR DEVICE” and filed on Feb. 3, 2019, the content of which is incorporated herein by reference in entirety.

TECHNICAL FIELD

The present disclosure relates to a field of semiconductor, and in particular to a vertical semiconductor device including a self-aligned gate, a method of manufacturing the semiconductor device, and an electronic apparatus including the semiconductor device.

BACKGROUND

In a horizontal device such as a metal oxide semiconductor field effect transistor (MOSFET), a source electrode, a gate electrode and a drain electrode are arranged in a direction substantially parallel to a surface of a substrate. Due to such an arrangement, it is not easy for the horizontal device to further reduce its occupied area while maintaining or improving device performance. Unlike this, in a vertical device, a source electrode, a gate electrode and a drain electrode are arranged in a direction substantially perpendicular to a surface of a substrate. Therefore, compared with the horizontal device, the vertical device has one more degree of freedom in a height direction for optimizing the device performance, so that it is easier to reduce the area occupied by the device while maintaining or improving the device performance. In addition, the vertical device may have good device characteristics, such as good electrostatic characteristics, good short-channel effect control, and small sub-threshold swing and a resulting low power consumption.

Therefore, a performance improvement of the vertical device is of great significance.

SUMMARY

According to one aspect of the present disclosure, there is provided a semiconductor device, including: a substrate; an active region extending vertically on the substrate, wherein the active region includes a first source/drain layer, a channel layer and a second source/drain layer that are sequentially stacked; a gate stack formed around at least part of an outer peripheral sidewall of the channel layer, wherein a sidewall of the gate stack close to the channel layer is aligned with the outer peripheral sidewall of the channel layer, so as to occupy substantially a same range in a vertical direction, and a part of the gate stack close to the channel layer has a shape that gradually tapers as getting close to the channel layer.

According to another aspect of the present disclosure, there is provided a semiconductor device, including: a substrate; an active region extending vertically on the substrate, wherein the active region includes a first source/drain layer, a channel layer and a second source/drain layer that are sequentially stacked; a hard mask layer formed on a top of the active region, wherein the hard mask layer has an outer peripheral sidewall substantially aligned with the outer peripheral sidewall of the channel layer in the vertical direction; and a gate stack formed around at least part of the outer peripheral sidewall of the channel layer, wherein a sidewall of the gate stack close to the channel layer is aligned with the outer peripheral sidewall of the channel layer, so as to occupy substantially a same range in the vertical direction.

According to another aspect of the present disclosure, there is provided a method of manufacturing a semiconductor device, including: providing a stack of a first source/drain layer, a channel layer and a second source/drain layer on a substrate, and forming a hard mask layer on the stack; transferring a pattern of the hard mask layer to the stack; making an outer peripheral sidewall of the first source/drain layer and an outer peripheral sidewall of the second source/drain layer recessed inwardly with respect to an outer peripheral sidewall of the hard mask layer; forming, under the hard mask layer, a growth inhibition layer on the outer peripheral sidewall of the first source/drain layer and the outer peripheral sidewall of the second source/drain layer; forming a sacrificial gate by selective epitaxial growth on the outer peripheral sidewall of the channel layer; forming a dielectric layer around the sacrificial gate, so that the dielectric layer at least partially exposes a sidewall of the sacrificial gate away from the stacked layer; removing the sacrificial gate by selective etching; and forming a gate stack in a space left by a removal of the sacrificial gate.

According to another aspect of the present disclosure, there is provided an electronic apparatus, including an integrated circuit formed at least partially by the semiconductor device described above.

BRIEF DESCRIPTION OF THE DRAWINGS

The above and other objectives, features and advantages of the present disclosure will be more apparent through the following description of embodiments of the present disclosure with reference to the drawings.

FIG. 3 to FIG. 14 show cross-sectional views along line AA' in FIG. 2(*a*).

Throughout the drawings, the same or similar reference numerals indicate the same or similar components.

DETAILED DESCRIPTION OF EMBODIMENTS

Figure 1:
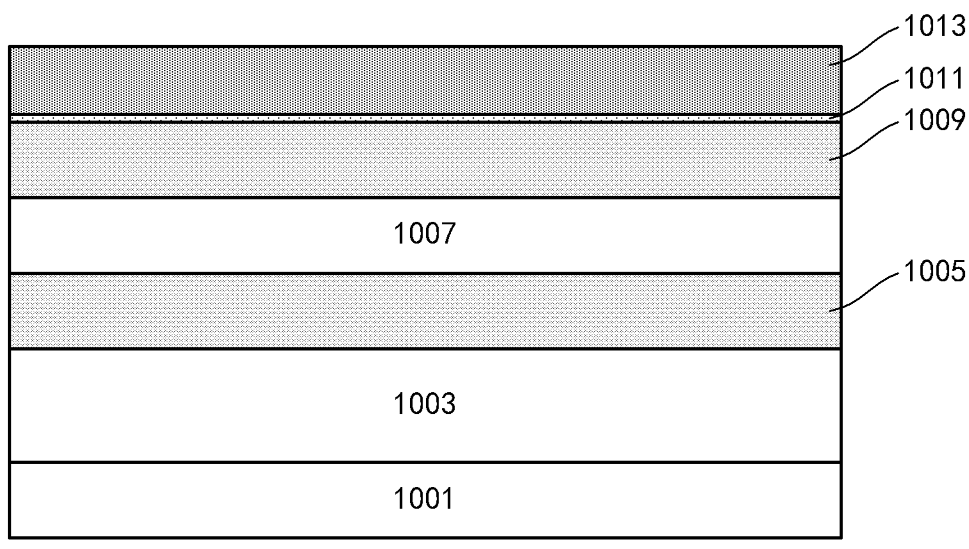
FIG. 1 to FIG. 14 show schematic diagrams of a process of manufacturing a semiconductor device according to the embodiments of the present disclosure, in which FIG. 2(*a*) shows a top view, and FIG. 1, FIG. 2(*b*)

Embodiments of the present disclosure will be described below with reference to the drawings. It should be understood, however, that these descriptions are merely exemplary and are not intended to limit the scope of the present disclosure. In addition, in the following description, descriptions of well-known structures and technologies are omitted to avoid unnecessarily obscuring the concept of the present disclosure.

Various schematic structural diagrams according to the embodiments of the present disclosure are shown in the drawings. The drawings are not drawn to scale. Some details are enlarged and some details may be omitted for clarity of presentation. The shapes of the various regions and layers shown in the drawings, as well as the relative size and positional relationship thereof, are only exemplary. In practice, there may be deviations due to manufacturing tolerances or technical limitations, and those skilled in the art may additionally design regions/layers with different shapes, sizes and relative positions according to actual needs.

In the context of the present disclosure, when a layer/element is referred to as being "on" another layer/element, the layer/element may be directly on the other layer/element, or there may be an intermediate layer/element between them. In addition, if a layer/element is located "on" another layer/element in one orientation, the layer/element may be located "under" the other layer/element when the orientation is reversed.

The semiconductor device according to the embodiments of the present disclosure is a vertical semiconductor device, and includes a vertical active region on a substrate (for example, in a direction substantially perpendicular to a surface of the substrate), which may include, for example, a first source/drain layer, a channel layer and a second source/drain layer sequentially stacked on the substrate. A source/drain region of the device may be formed in the first source/drain layer and the second source/drain layer, and a channel region of the device may be formed in the channel layer. A conductive channel may be formed between the source/drain regions located on both ends of the channel region through the channel region. The active region, especially the channel layer, may exhibit a shape of a nanowire, so that a nanowire device is obtained. Alternatively, the active region, especially the channel layer, may exhibit a shape of a nanosheet, so that a nanosheet device is obtained.

According to the embodiments of the present disclosure, such a semiconductor device may be a conventional field effect transistor (FET). In a case of the FET, the first source/drain layer and the second source/drain layer (in other words, the source/drain regions on both sides of the channel layer) may have the same conductivity type (for example, n-type or p-type) of doping. A conductive channel may be formed between the source/drain regions located on both ends of the channel region through the channel region. Alternatively, such a semiconductor device may be a tunneling FET. In a case of the tunneling FET, the first source/drain layer and the second source/drain layer (in other words, the source/drain regions on both sides of the channel layer) may have different conductivity types (for example, n-type and p-type, respectively) of doping. In this case, charged particles such as electrons may tunnel from the source region through the channel region to the drain region, so that a conduction path is formed between the source region and the drain region. Although conventional FET and tunneling FET have different conduction mechanisms, they both exhibit electrical properties of controlling the conduction between the source/drain regions through the gate. Therefore, for the conventional FET and tunneling FET, the terms "source/drain layer (source/drain region)" and "channel layer (channel region)" are unified for description, although there is no "channel" in the common sense in the tunneling FET.

A gate stack may be formed around at least part of a periphery of the channel layer. The gate stack may be self-aligned to the channel layer. For example, a sidewall of the gate stack close to the channel layer may be aligned with an outer peripheral sidewall of the channel layer so as to occupy substantially the same range in the vertical direction. In this way, an overlap of the gate stack and the source/drain region may be reduced or even avoided, which helps to reduce a parasitic capacitance between the gate and the source/drain.

The channel layer may be made of a single crystal semiconductor material to improve device performance. Certainly, the first source/drain layer and the second source/drain layer may also be made of a single crystal semiconductor material. In this case, the single crystal semiconductor material of the channel layer and the single crystal semiconductor material of the source/drain layer may be eutectic.

According to the embodiments of the present disclosure, the channel layer may have etching selectivity with respect to the first and second source/drain layers, for example, contain different semiconductor materials. In this way, it is advantageous to process the channel layer, such as by selective etching. In addition, the first source/drain layer and the second source/drain layer may contain the same semiconductor material.

According to the embodiments of the present disclosure, a leakage limiting layer or an on-state current enhancement layer may be further provided between the first source/drain layer and the channel layer and/or between the channel layer and the second source/drain layer (especially between two layers forming a tunnel junction in the case of the tunneling FET). The leakage limiting layer may have a band gap greater than that of at least one of a layer immediately above the leakage limiting layer and a layer immediately below the leakage limiting layer. The on-state current enhancement layer may have a band gap smaller than that of at least one of a layer immediately above the on-state current enhancement layer and a layer immediately below the on-state current enhancement layer. Due to this difference in the band gap, a leakage may be suppressed or an on-state current may be enhanced.

The semiconductor device may be manufactured as follows, for example.

According to the embodiments of the present disclosure, a first source/drain layer, a channel layer, and a second source/drain layer may be sequentially formed on a substrate. In addition, in order to facilitate subsequent electrical contact to the first source/drain layer, a contact layer may be provided under the first source/drain layer. For example, these layers may be formed by epitaxial growth. Due to the separate epitaxial growth, there may be a clear crystal interface between at least a pair of adjacent layers. In addition, the layers may be doped separately, so that there may be a doping concentration interface between at least a pair of adjacent layers.

For a stack of the first source/drain layer, the channel layer and the second source/drain layer (and the leakage limiting layer or the on-state current enhancement layer, if present), the active region may be defined therein. For example, they may be patterned into a desired shape. To facilitate patterning, a hard mask layer may be provided on a top of the stack. The hard mask layer may define a body position of the active region. Generally, the active region may have a columnar shape.

Then, a gate stack may be formed around at least part of a periphery of the channel layer. According to the embodiments of the present disclosure, a replacement gate process may be used to form the gate stack in a self-alignment manner. For example, a sacrificial gate may be grown on a sidewall of the channel layer by using selective epitaxial growth (SEG), and then the sacrificial gate may be replaced with a gate stack. Due to the selective epitaxial growth, the sacrificial gate and the gate stack that subsequently replaces the sacrificial gate may be self-aligned to the channel layer. In addition, the sacrificial gate may be grown from a semiconductor crystal of the channel layer, so that at least part of its surface may be formed along a crystal plane of the crystal of the channel layer.

Since the gate stack is self-aligned to the channel layer, a gate length may be substantially equal to a thickness of the channel layer. When the channel layer is formed by epitaxial growth, its thickness may be well controlled, so the gate length may be controlled more accurately.

To ensure that the sacrificial gate is only grown on the sidewall of the channel layer and not on the sidewall of the source/drain layer, a growth inhibition layer (for example, a dielectric layer) may be formed on the sidewall of the source/drain layer. The growth inhibition layer may also be formed in a self-alignment manner. For example, the outer peripheral sidewall of the first source/drain layer and the outer peripheral sidewall of the second source/drain layer may be recessed inwardly with respect to an outer peripheral sidewall of the hard mask layer, and the growth inhibition layer may be filled in such recesses.

In order to maintain a position of the sacrificial gate during the replacement process, a dielectric layer may be formed around the sacrificial gate. The dielectric layer may at least partially expose a sidewall of the sacrificial gate away from the stack, so as to facilitate the replacement. The dielectric layer may be in a form of a spacer.

The present disclosure may be presented in various forms, some examples of which will be described below.

FIG. 1 to FIG. 14 show schematic diagrams of a process of manufacturing a semiconductor device according to the embodiments of the present disclosure.

As shown in FIG. 1, a substrate 1001 is provided. The substrate 1001 may be in various forms, including but not limited to a bulk semiconductor material substrate such as a bulk Si substrate, a semiconductor-on-insulator (SOI) substrate, a compound semiconductor substrate such as a SiGe substrate, and the like. In the following description, for ease of description, a bulk Si substrate is illustrated by way of example.

A well region may be formed in the substrate 1001. If a p-type device is to be formed, the well region may be an n-type well. If an n-type device is to be formed, the well region may be a p-type well. The well region may be formed, for example, by injecting a dopant of a corresponding conductivity type (a p-type dopant such as B or In, or an n-type dopant such as As or P) into the substrate 1001 and then performing thermal annealing. There are many ways to provide such well region in the art, which will not be described in detail here.

A contact layer 1003 may be formed by, for example, epitaxial growth, on the substrate 1001. The contact layer 1003 is then used to provide an electrical contact to the lower source/drain region of the device. To this end, the contact layer 1003 may be doped to the same conductivity type as the lower source/drain region of the device, for example, n-type doping for n-type device and p-type doping for p-type device. The doping concentration may be about 1E18-5E21 $cm^{-3}$. The doping of the contact layer 1003 may be achieved by in-situ doping during the epitaxial growth. The contact layer 1003 may contain the same semiconductor material as the substrate 1001, such as Si. Certainly, the contact layer 1003 may also contain a semiconductor material different from that of the substrate 1001.

Certainly, the present disclosure is not limited to providing the electrical contact to the lower source/drain region through such a contact layer. For example, the electrical contact to the lower source/drain region may be provided through a via hole penetrating the substrate. In this case, the contact layer 1003 may be omitted.

On the contact layer 1003, a first source/drain layer 1005, a channel layer 1007 and a second source/drain layer 1009 may be sequentially formed by, for example, epitaxial growth. These are all layers of semiconductor materials. For example, the channel layer 1007 may contain a semiconductor material such as Si that is different from the first source/drain layer 1005 and the second source/drain layer 1009, and may have a thickness of about 10 nm to 100 nm. The first source/drain layer 1005 and the second source/drain layer 1009 may contain the same semiconductor material such as SiGe (an atomic percentage of Ge may be about 10% to 40%), and may have a thickness of about 20 nm to 100 nm.

Certainly, the present disclosure is not limited to this. For example, the channel layer 1007 may contain a semiconductor material with the same composition as the first source/drain layer 1005 or the second source/drain layer 1009 but have a different composition content (for example, both may contain SiGe, but atomic percentages of Ge are different), as long as the channel layer 1007 has etching selectivity with respect to the first source/drain layer 1005 below the channel layer 1007 and the second source/drain layer 1009 above the channel layer 1007.

When growing the first source/drain layer 1005, the channel layer 1007 and the second source/drain layer 1009, an in-situ doping may be performed to achieve desired conductivity type and doping concentration. For example, in the case of forming an n-type FET, the first source/drain layer 1005 and the second source/drain layer 1009 may be doped into n-type with n-type dopant such as As or P, and the doping concentration may be about 1E19-2E21 $cm^{-3}$. In the case of forming a p-type FET, the first source/drain layer 1005 and the second source/drain layer 1009 may be doped into p-type with p-type dopant such as B or In, and the doping concentration may be about 1E19-5E20 $cm^{-3}$. The channel layer 1005 may not be intentionally doped, or may be lightly doped to adjust a threshold voltage (Vt) of the device. In the case of forming a tunneling FET, the first source/drain layer 1005 and the second source/drain layer 1009 may be doped to opposite conductivity types. Certainly, the doping method is not limited to in-situ doping, and other methods such as ion implantation may also be used.

In addition, in the case of forming an additional source/drain layer as described below, the first source/drain layer 1005 and the second source/drain layer 1009 may not be intentionally doped at this stage.

According to another embodiment of the present disclosure, the first source/drain layer 1005, the channel layer 1007 and the second source/drain layer 1009 may contain the same semiconductor material such as Si, but are doped differently to achieve desired etching selectivity. For example, the first source/drain layer 1005 and the second source/drain layer 1009 may be relatively heavily doped (for example, with a doping concentration of about 1E19-5E21 $cm^{-3}$ for n-type, and a doping concentration of about 1E19-5E20 $cm^{-3}$ for p-type), and the channel layer 1007 may not be intentionally doped or may be relatively lightly doped. The heavily doped Si and the non-doped or lightly doped Si may have etching selectivity with respect to each other.

A hard mask layer may be formed on the second source/drain layer 1009. The hard mask layer may include a stacked structure, such as a first hard mask layer 1011 and a second hard mask layer 1013. The first hard mask layer 1011 may be used for protection and/or etch stop. For example, it may contain oxide (for example, silicon oxide) with a thickness of about 2 nm to 5 nm, and may be formed by deposition or thermal oxidation (the oxide formed by thermal oxidation has better quality). The second hard mask layer 1013 may be used for purposes such as masking and/or isolation. For example, it may contain nitride (for example, silicon nitride) or a low-k dielectric material (for example, silicon carbide-based material) with a thickness of about 10 nm to 100 nm, and may be formed by deposition.

Next, the active region of the device may be defined. For example, this may be performed as follows.

Figure 2A:
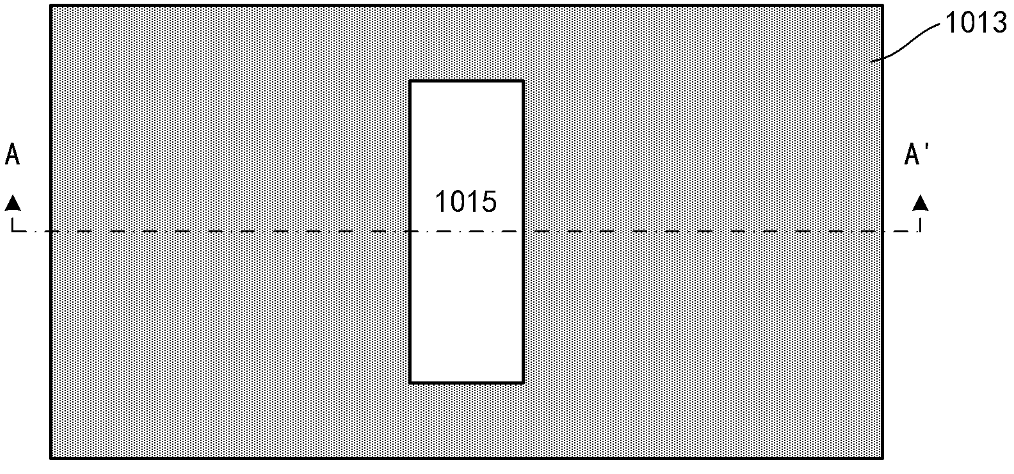
Figure 2B:
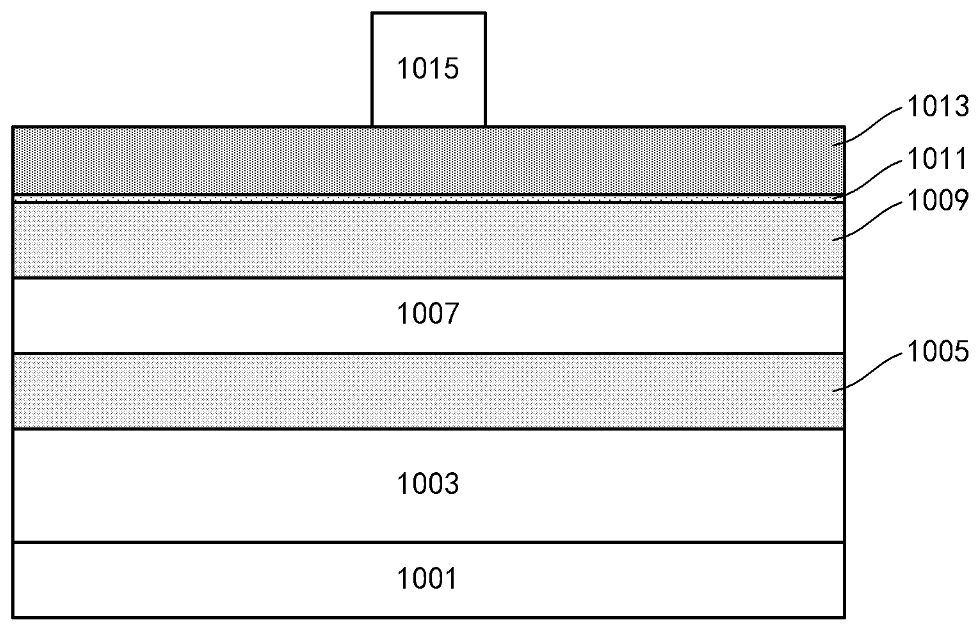

As shown in FIG. 2(*a*) and FIG. 2(*b*), a photoresist 1015 may be formed on the hard mask layer. The photoresist 1015 is patterned into a desired shape (in this example, substantially rectangle) by photolithography (exposure and development). Certainly, the pattern of the photoresist 1015 is not limited to a rectangle, but may be various suitable shapes, such as a circle, an ellipse, a square, and so on. For example, in a case of the circle, a nanowire device may be formed, and in a case of the rectangle, a nanosheet device may be formed.

Figure 3:
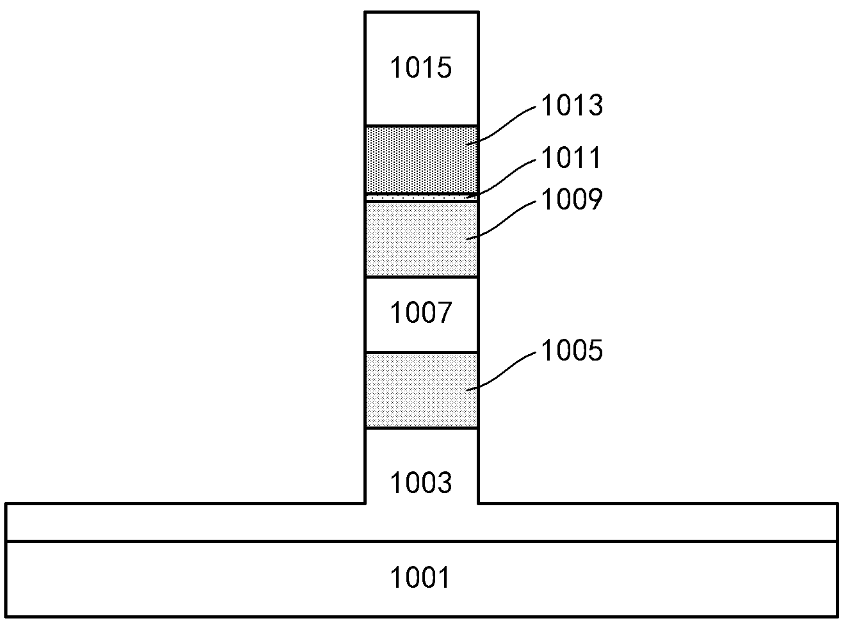

Then, the pattern of the photoresist 1015 may be transferred to the hard mask layer, and then to the semiconductor layer below the photoresist 1015. Specifically, as shown in FIG. 3, the patterned photoresist 1015 may be used as a mask to perform selective etching such as reactive ion etching (RIE) on the hard mask layer (1013, 1011), the second source/drain layer 1009, the channel layer 1007, and the first source/drain layer 1005 sequentially. In this example, the selective etching such as RIE may be further performed on the contact layer 1003, but a bottom surface of the contact layer 1003 is not etched. In this way, a part of the contact layer 1003 may still extend outside a range defined by the hard mask layer, so that a contact portion thereto may be made relatively easily later. A groove is formed in the contact layer 1003, and then a shallow trench isolation (STI) may be formed in the groove. After etching, the second source/drain layer 1009, the channel layer 1007, and the first source/drain layer 1005 may form a column (in this example, a hexahedral column with a rectangular cross section), which defines the active region. For example, RIE may be performed in a direction substantially perpendicular to the surface of the substrate, so that the column is also substantially perpendicular to the surface of the substrate. After that, the photoresist 1015 may be removed. Currently, outer peripheral sidewalls of various layers in the active region are substantially coplanar with the outer peripheral sidewall of the hard mask layer. In subsequent processes, the shapes of the layers in the active region may be further adjusted as needed (for example, to make the sidewall recessed).

Figure 4:
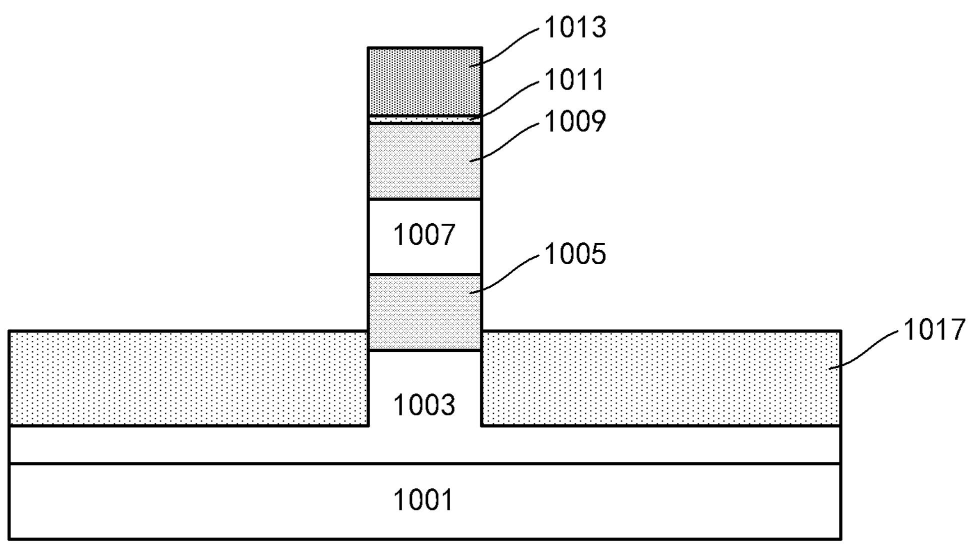

In the groove formed in the contact layer 1003, a dielectric material may be filled to form the STI. For example, an oxide may be deposited on a structure shown in FIG. 3 (the photoresist 1015 is removed), and the deposited oxide may have a top surface higher than that of the hard mask layer. A planarization process such as chemical mechanical polishing (CMP) is performed on the oxide (the hard mask layer such as the second hard mask layer 1013 may be used as a stop layer), and then etching back (for example, wet etching, vapor etching, vapor HF, etc.) is performed to form an STI 1017, as shown in FIG. 4. The formed STI 1017 surrounds the active region. Here, after the etching back, a top surface of the STI 1017 may be higher than the top surface of the contact layer 1003, so as to avoid a possibility of growing a sacrificial gate on the surface of the contact layer 1003 later. In addition, after the etching back, the top surface of the STI 1017 may be lower than the bottom surface of the channel layer 1007 so as to expose the entire sidewall of the channel layer 1007, so that the sacrificial gate may be grown on the entire sidewall of the channel layer 1007 later.

As described above, in order to prevent the sacrificial gate from growing on the surface of the source/drain layer, a growth inhibition layer may be formed on the surface of the source/drain layer.

Figure 5:
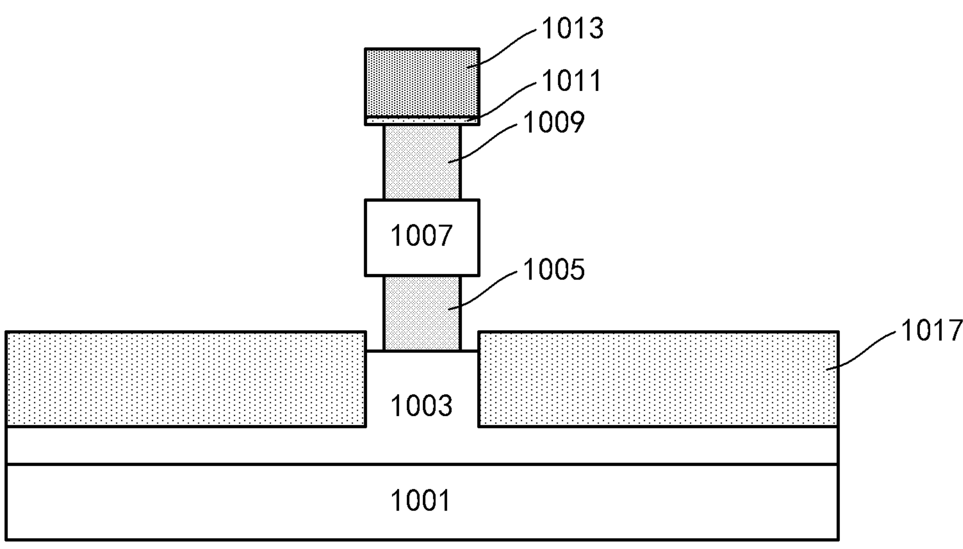

To this end, as shown in FIG. 5, the outer peripheral sidewall of the first source/drain layer 1005 and the outer peripheral sidewall of the second source/drain layer 1009 may be recessed with respect to the outer peripheral sidewall of the hard mask layer (in this example, recessed in a lateral direction substantially parallel to the surface of the substrate). This may be achieved by further selectively etching the first source/drain layer 1005 and the second source/drain layer 1009 with respect to the channel layer 1007, for example, by about 2 nm to 5 nm. As described above, because the channel layer 1007 has etching selectivity with respect to the first source/drain layer 1005 and the second source/drain layer 1009, such selective etching may be achieved.

The selective etching may be precise and controllable by using atomic layer etching (ALE). For example, in a case that the first source/drain layer 1005 and the second source/drain layer 1009 contain SiGe and the channel layer 1007 contains Si, SiGeO may be formed on the surface of the first source/drain layer 1005 and the surface of the second source/drain layer 1009 by thermal oxidation, and then SiGeO may be removed. The first source/drain layer 1005 and the second source/drain layer 1009 may be selectively etched by repeating thermal oxidation and removal of SiGeO. Alternatively, in a case that the first source/drain layer 1005 and the second source/drain layer 1009 contain heavily doped Si and the channel layer 1007 contains undoped or lightly doped Si, the first source/drain layer 1005 and the second source/drain layer 1009 may be etched by a TMAH solution (for n-type doped source/drain layer) or an acid solution containing HF, $HNO_3$ and $H_2O$ (for p-type doped source/drain layer).

Figure 6:
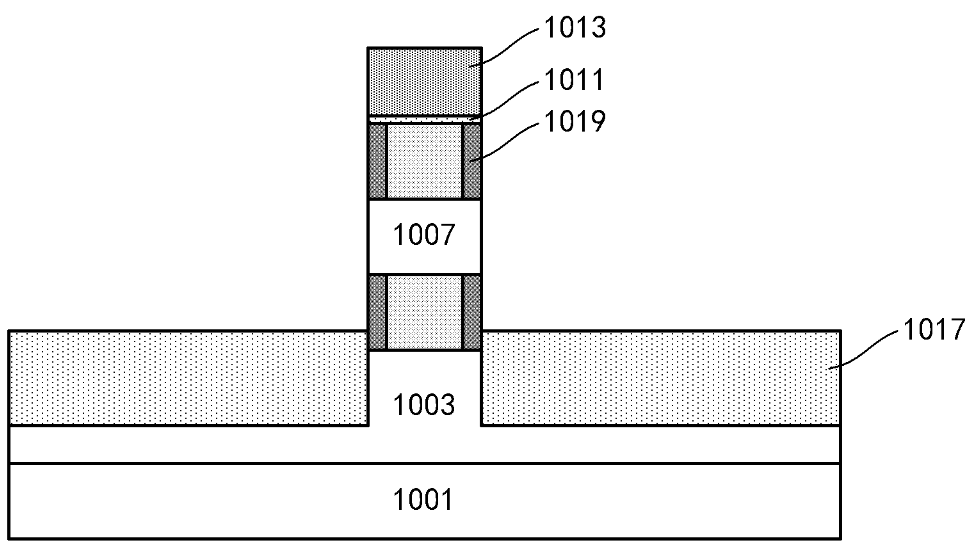

Then, as shown in FIG. 6, a growth inhibition layer 1019 may be formed in the recess of the outer peripheral sidewall of the first source/drain layer 1005 and the recess of the outer peripheral sidewall of the second source/drain layer 1009 with respect to the outer peripheral sidewall of the hard mask layer. The growth inhibition layer 1019 may have different surface characteristics from the channel layer 1007, so that a certain material may grow on the surface of the channel layer 1007 without or substantially without growing on the surface of the growth inhibition layer 1019. For example, the growth inhibition layer 1019 may contain a dielectric material such as SiC or oxynitride. The growth inhibition layer 1019 may be formed by depositing a layer of dielectric material on the structure shown in FIG. 5 and performing etching back such as vertical RIE on the deposited dielectric material. In order to fully fill the above recesses, a thickness of the deposited dielectric material may be greater than a previous etching depth of the source/drain layer, and may be, for example, about 3 nm to 7 nm. In this way, the growth inhibition layer 1019 may be filled in the recesses and self-aligned to the source/drain layer, thereby fully covering the surface of the source/drain layer and exposing the surface of the channel layer.

Figure 7:
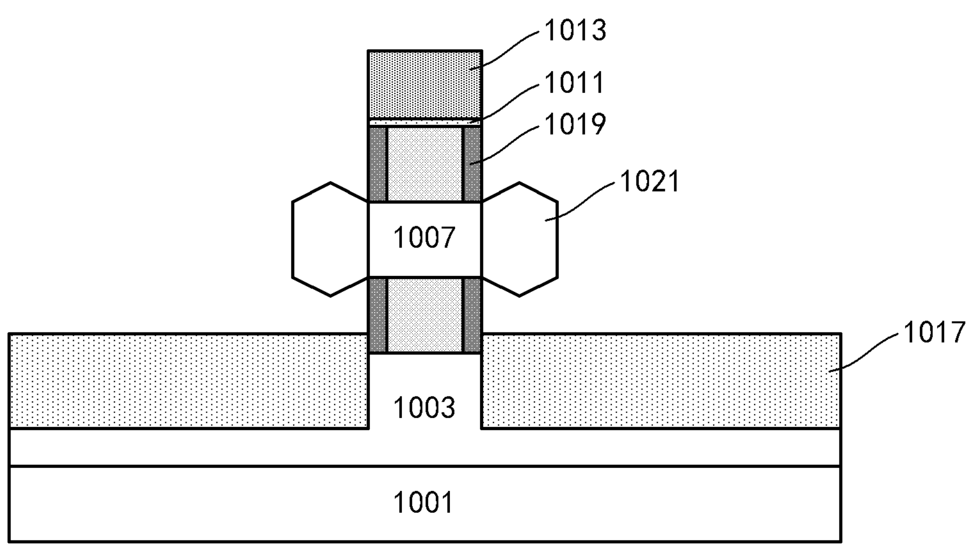

As shown in FIG. 6, through the above processing, among all the surfaces currently exposed to the outside, only the surface of the channel layer 1007 is a surface of semiconductor crystal. Therefore, as shown in FIG. 7, a first sacrificial gate 1021 may be grown on the surface of the channel layer 1007 by selective epitaxial growth. Due to the selective epitaxial growth, the first sacrificial gate 1021 may only grow on the surface of the channel layer 1007, without or substantially without growing on other surfaces. Therefore, the first sacrificial gate 1021 may be self-aligned to the channel layer 1007.

The first sacrificial gate 1021 may contain a semiconductor material having etching selectivity with respect to the channel layer 1007, such as SiGe. Because the first sacrificial gate 1021 is grown from the surface of the channel layer 1007 by using the channel layer 1007 as a seed, at least part of the surface (for example, an inclined surface shown in FIG. 7) of the first sacrificial gate 1021 may be formed along a crystal plane of the semiconductor crystal of the channel layer. Therefore, the grown first sacrificial gate 1021 may exhibit a shape as shown in FIG. 7, that is, has a thickness in the vertical direction that first gradually increases and then gradually decreases as getting close to the channel layer.

Subsequently, the first sacrificial gate 1021 may be replaced with a gate stack. According to the embodiments of the present disclosure, in order to avoid a subsequent growth of an additional source/drain layer on the first sacrificial gate 1021, or a possible damage to the source/drain layer in the process of replacing the sacrificial gate (in this example, the first sacrificial gate 1021 and the source/drain layer both contain SiGe), the first sacrificial gate 1021 may be firstly replaced with a second sacrificial gate that may inhibit growth of semiconductor material or that has high etching selectivity with respect to the source/drain layer (and the channel layer), such as a dielectric material.

In order to achieve this replacement, a material layer such as dielectric may be formed around an outer periphery of the first sacrificial gate 1021 so as to maintain a position of the first sacrificial gate 1021. Here, a side of the first sacrificial gate 1021 facing the channel layer 1007 is important, because this determines a relative positional relationship between the first sacrificial gate 1021 (and the second sacrificial gate and the gate stack that replace the first sacrificial gate 1021 later) and the channel layer 1007. Therefore, the material layer at least surrounds an outer periphery of an end of the first sacrificial gate 1021 close to the channel layer 1007. In addition, the material layer also needs to expose part of the surface of the first sacrificial gate 1021, such as at least part of the sidewall away from the channel layer 1007, for subsequent replacement processing.

Figure 8:
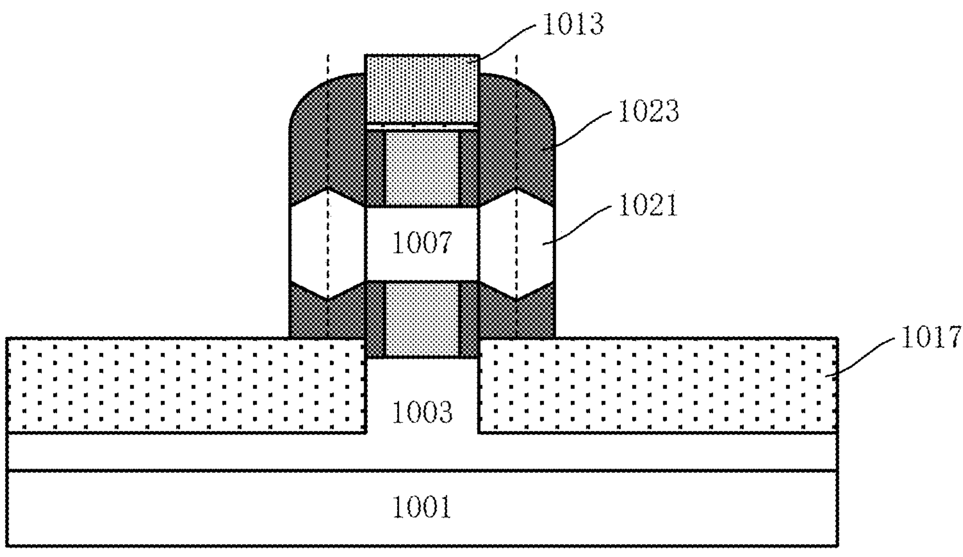

In view of this, it is advantageous to form such a material layer in the form of a spacer. As shown in FIG. 8, a material layer such as SiC may be deposited in a substantially conformal manner on the structure shown in FIG. 7, and the RIE is performed on the deposited material layer in the vertical direction to remove a lateral extension part and remain a vertical extension part, so that a spacer 1023 is obtained. Here, the sidewall spacer 1023 may have a thickness (a size in the horizontal direction shown) not greater than a thickness (a size in the horizontal direction shown) of the first sacrificial gate 1021, so as to expose the sidewall of the first sacrificial gate 1021 away from the channel layer 1007.

In this example, a thickness of the spacer 1023 is substantially the same as the thickness of the first sacrificial gate 1021, so that the position of the entire first sacrificial gate 1021 may be substantially maintained. However, the present disclosure is not limited to this. For example, the thickness of the spacer 1023 may be smaller than the thickness of the first sacrificial gate 1021, so that the sidewall of the spacer 1023 may even be located inside the position shown by the dotted line in FIG. 8. In this case, the spacer 1023 may only maintain the position of a part of the first sacrificial gate 1021 (close to the channel layer).

Figure 9:
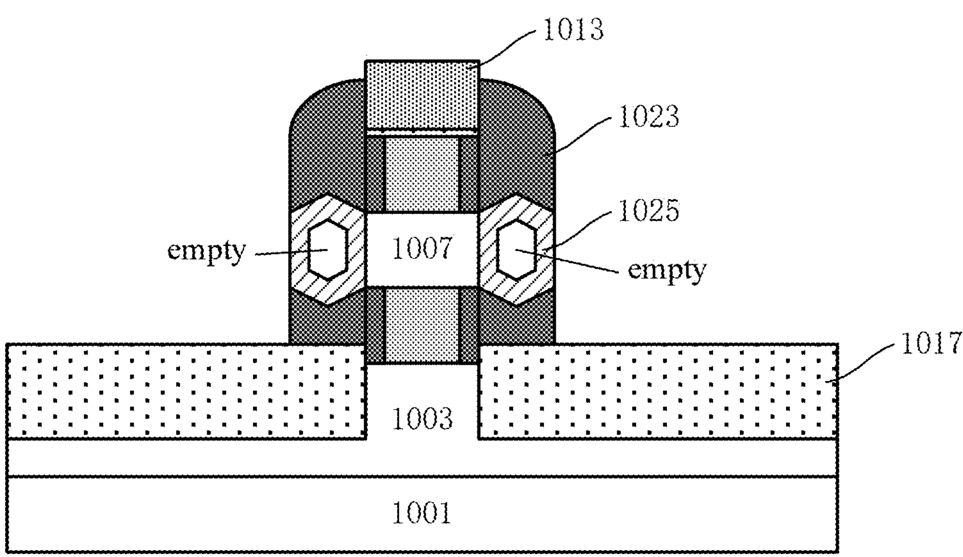

Next, as shown in FIG. 9, the first sacrificial gate 1021 may be replaced with a second sacrificial gate 1025. For example, the first sacrificial gate 1021 may be removed by selective etching, and then a space left in the spacer 1023 due to the removal of the first sacrificial gate 1021 may be filled with a dielectric material such as oxynitride so as to form the second sacrificial gate 1025. The filling may be achieved by deposition and then etch back. In this example, due to the shape of the first sacrificial gate 1021, the space left after the removal of the first sacrificial gate 1021 has a large middle and a small opening, so that the second sacrificial gate 1025 may form a hollow structure. Certainly, the present disclosure is not limited to this. Through a deposition process with good filling characteristics, the second sacrificial gate 1025 may be a solid structure. In addition, in a case that the sidewall of the spacer 1023 is located inside the position shown by the dotted line in FIG. 8, the space left after the removal of the first sacrificial gate 1021 exhibits a shape that gradually tapers toward the channel layer 1007. Accordingly, the second sacrificial gate 1025 may also exhibit this shape, and may also be a solid structure.

After that, the second sacrificial gate 1025 may be replaced with a gate stack. Certainly, if an additional source/drain layer is not grown subsequently or if the first sacrificial gate has sufficient etching selectivity with respect to the source/drain layer and the channel layer, an operation of replacing the first sacrificial gate with the second sacrificial gate may be omitted. In this case, the second sacrificial gate in the following description may be changed to the first sacrificial gate.

In addition, according to the embodiments of the present disclosure, in order to improve the device performance, an additional source/drain layer may be formed on the outer periphery of the source/drain layer.

Figure 10:
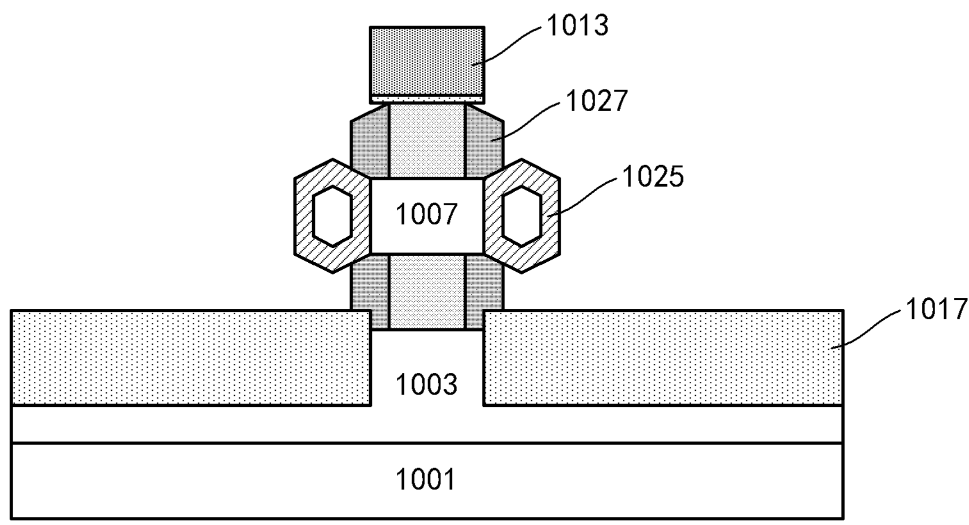

To this end, as shown in FIG. 10, the spacer 1023 and the growth inhibition layer 1019 (in this example, both are SiC) may be removed by selective etching, so that the sidewall of the first source/drain layer 1005 and the sidewall of the second source/drain layer 1009 are exposed. On the sidewall of the first source/drain layer 1005 and the sidewall of the second source/drain layer 1009, an additional source/drain layer 1027 may be formed by selective epitaxial growth. In this case, since the second sacrificial gate 1025 is made of a dielectric material, the growth of the additional source/drain layer 1027 from the surface of the second sacrificial gate 1025 may be avoided. Due to the selective epitaxial growth, the additional source/drain layer 1027 may also be self-aligned to the first source/drain layer 1005 and the second source/drain layer 1009.

The additional source/drain layer 1027 may contain the same semiconductor material as the first source/drain layer 1005 and the second source/drain layer 1009, such as Si, or may contain a different semiconductor material, for example, to implement stress engineering. For example, for a p-type device, the additional source/drain layer 1027 may contain SiGe so as to apply compressive stress to the channel layer 1007, and for an n-type device, the additional source/drain layer 1027 may contain SiGe so as to apply tensile stress to the channel layer 1007. During the growth process, the additional source/drain layer 1027 may be doped to a desired conductivity type and doping concentration. For example, in the case of forming an n-type FET, the additional source/drain layer 1027 may be doped into n-type with n-type dopant such as As or P, and a doping concentration may be about 1E19-2E21 $cm^{-3}$; in the case of forming a p-type FET, the additional source/drain layer 1027 may be doped into p-type with p-type dopant such as B or In, and a doping concentration may be about 1E19-5E20 $cm^{-3}$. Annealing may be performed at, for example, about 800-1050° C. to activate implanted impurities, and the impurities may be driven into the first source/drain layer 1005 and the second source/drain layer 1009 in a case that the source/drain layer 1005 and the second source/drain layer 1009 are not previously doped.

In addition, prior to the growth of the additional source/drain layer 1027, selective etching may be performed first on the first source/drain layer 1005 and the second source/drain layer 1009. For example, this may enhance the stress in the channel generated due to the additional source/drain layer, and therefore may increase the on-state current of the device.

Certainly, the additional source/drain layer may not be formed. In this case, in the process of growing the source/drain layer described above in conjunction with FIG. 1, the source/drain layer may be doped in situ to the desired conductivity type and doping concentration.

Figure 11:
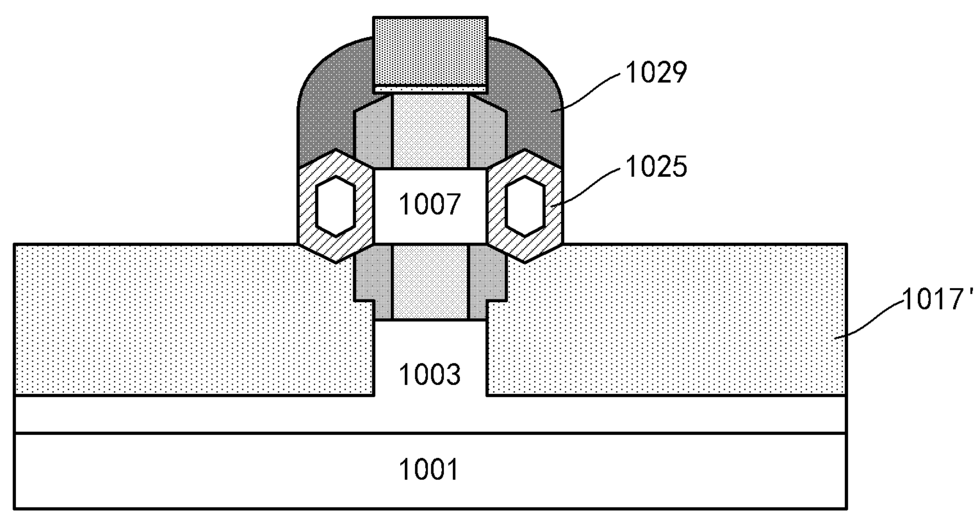

After that, the second sacrificial gate 1025 may be replaced. As described above, it is necessary to form a material layer (for example, the spacer as described above) to maintain the position of the second sacrificial gate 1025. For example, as shown in FIG. 11, a spacer 1029 such as SiC may be formed. In FIG. 11, only the spacer 1029 above the second sacrificial gate 1025 is shown (this is because in this example, a STI 1017' described below may be under the second sacrificial gate 1025 to maintain the position of the second sacrificial gate 1025), but the spacer 1029 may also be formed under the second sacrificial gate 1025. Although a thickness of the spacer 1029 is substantially the same as the thickness of the second sacrificial gate 1025 in this example, however, as described above, the thickness of the spacer 1029 may be smaller than the thickness of the second sacrificial gate 1025.

In addition, in order to facilitate subsequent manufacturing of a contact portion to the gate stack (a gate conductor layer therein), the gate stack may be extended beyond the range defined by the hard mask layer. To this end, a top surface of the STI 1017 may be raised (denoted as 1017') to at least surround a lower surface of an end of the second sacrificial gate 1025 close to the channel layer. For example, the top surface of the STI 1017' is not lower than the bottom surface of the channel layer 1007, so that both the STI 1017' and the spacer 1029 may at least surround the entire periphery of the end of the second sacrificial gate 1025 close to the channel layer, and expose at least part of the sidewall of the second sacrificial gate 1025 away from the channel layer. For example, an oxide may be deposited on the STI 1017, a planarization processing such as CMP may be performed on the deposited oxide (and may be stopped at the hard mask layer), and the planarized oxide may be etched back (for example, by wet etching or vapor etching), so as to form the STI 1017'.

Figure 12:
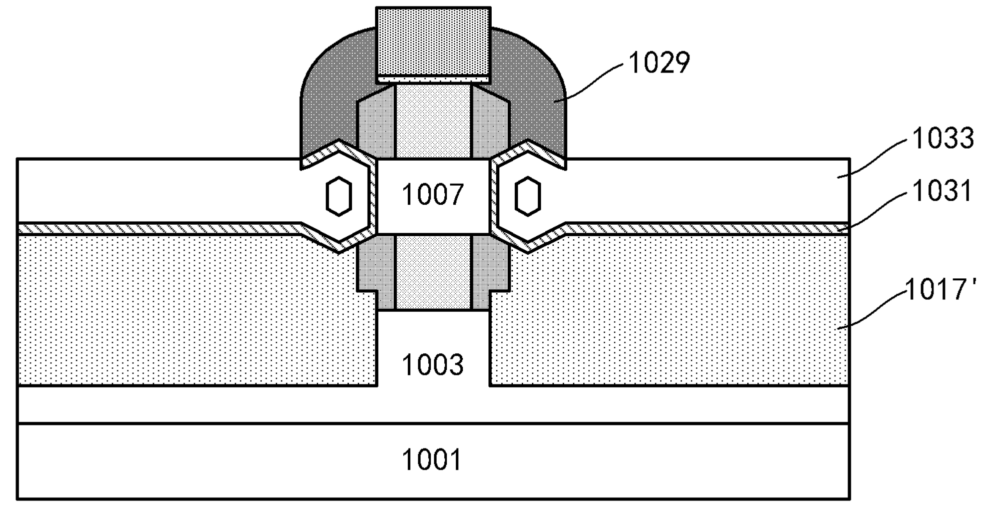

Next, a replacement gate process may be performed. For example, as shown in FIG. 12, the second sacrificial gate 1025 may be removed by selective etching so as to release the space occupied by it. After that, a gate stack may be formed. For example, a gate dielectric layer 1031 and a gate conductor layer 1033 may be deposited sequentially on the structure shown in FIG. 11 (the second sacrificial gate 1025 is removed). The gate dielectric layer 1031 may be formed in a substantially conformal manner, with a thickness of, for example, about 2 nm to 7 nm. The gate conductor layer 1033 may sufficiently fill the space released due to the removal of the second sacrificial gate 1025 (as described above, the space may have a hollow structure based on the shape of the second sacrificial gate 1025) so that, for example, a top surface of the gate conductor layer 1033 may exceed the top surface of the hard mask layer. The deposited gate conductor layer 1033 and optionally the gate dielectric layer 1031 may be etched back. Prior to the etching back, a planarization processing such as CMP may be performed on the gate conductor layer 1033 (and may be stopped at the hard mask layer). The etching back may be performed by vertical RIE. Subsequent to the etching back, the top surface of the gate conductor layer 1033 may be lower than the top surface of the second source/drain layer 1009, for example, in proximity to the top surface of the channel layer 1007.

For example, the gate dielectric layer 1031 may contain a high-k gate dielectric such as $HfO_2$, and the gate conductor layer 1033 may contain a metal gate conductor. In addition, a work function adjustment layer may be further formed between the gate dielectric layer 1031 and the gate conductor layer 1033 (in a substantially conformal manner). An interface layer such as thermal oxide may be further formed before the gate dielectric layer 1031 is formed.

In this way, the end of the gate stack close to the channel layer occupies the space released due to the removal of the second sacrificial gate 1025, and is therefore self-aligned to the channel layer 1007.

According to other embodiments of the present disclosure, after the sacrificial gate 1025 is removed and before the gate stack is formed, a further selective etching may be performed on the channel layer 1007 to make it thinner (therefore recessed inwardly with respect to the hard mask layer) so as to improve the device performance. In this case, the end of the gate stack may further include a part corresponding to an etched part of the channel layer 1007, but is still self-aligned to the channel layer 1007.

Figure 13:
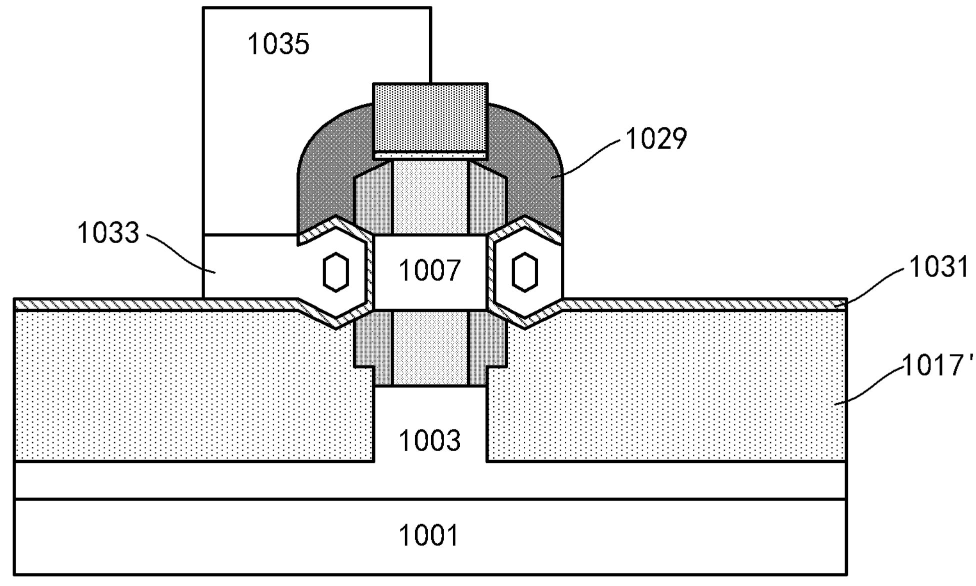

The gate conductor layer 1033 may be patterned to form a landing pad. For example, as shown in FIG. 13, a photoresist 1035 may be used to shield a part of the gate conductor layer 1033, and the photoresist 1035 and the spacer 1029 may be used as masks to perform selective etching such as vertical RIE on the gate conductor layer 1033 (and optionally the gate dielectric layer 1031). Therefore, the gate conductor layer 1033 may be removed except for the part occupying the space released due to the removal of the second sacrificial gate 1025 and the part shielded by the photoresist 1035. In this way, the gate conductor layer 1033 may have substantially the same shape as the space released due to the removal of the second sacrificial gate 1025, except that it includes an extension part corresponding to the photoresist 1035 (which may be strip-shaped and which is then used as the landing pad).

It should be pointed out that the extension part of the gate conductor layer 1033 may increase a manufacturing margin of the contact portion to the gate conductor layer 1033, but this is not necessary. For example, the subsequent contact portion to the gate conductor layer may directly extend from above the spacer 1029 through the spacer 1029 to contact the gate conductor layer 1033. In this case, the selective etching may be performed on the gate conductor layer directly by using the spacer 1029 as the mask, so that the gate conductor layer may have substantially the same shape as the space released due to the removal of the second sacrificial gate 1025.

Figure 14:
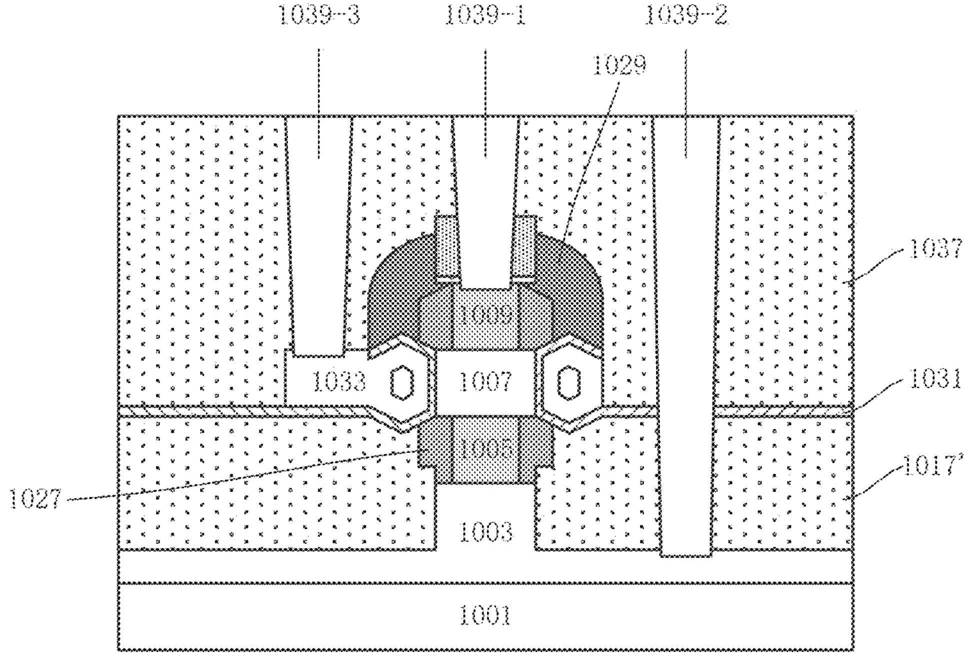

Next, various contact portions may be formed. For example, as shown in FIG. 14, an interlayer dielectric layer

1037 may be formed on the structure shown in FIG. 13 (the photoresist 1035 is removed). For example, an oxide may be deposited, and a planarization process such as CMP may be performed on the deposited oxide to form the interlayer dielectric layer 1037. In the interlayer dielectric layer 1037, a contact portion 1039-1 to the second source/drain layer 1009, a contact portion 1039-2 to the contact layer 1003 and therefore to the first source/drain layer 1005, and a contact portion 1039-3 to the gate conductor layer 1033 may be formed. These contact portions may be formed by etching holes and filling the holes with a conductive material such as metal. Among these contact portions, the contact portion 1039-1 to the second source/drain layer 1009 may be substantially located in a center of the active region and may extend vertically to the second source/drain layer 1009; the contact portion 1039-2 to the first source/drain layer 1005 may be located outside the hard mask layer and extend vertically to the contact layer 1003; the contact portion 1039-3 to the gate conductor layer 1033 may be located at the landing pad described above and extend vertically to the gate conductor layer 1033. To avoid mutual interference between each other, the contact portion 1039-3 to the gate conductor layer and the contact portion 1039-2 to the first source/drain layer 1005 may be located on opposite sides with respect to the contact portion 1039-1 to the second source/drain layer 1009 (left and right sides shown in FIG. 14).

According to the embodiments of the present disclosure, the gate stack may be self-aligned to the channel layer, so that an overlap between the gate stack and the source/drain may be reduced or even avoided. In addition, a gate length may be determined generally by the thickness of the channel layer, so that the gate length may be controlled more accurately.

The semiconductor device according to the embodiments of the present disclosure is applicable to various electronic apparatuses. For example, it is possible to form an integrated circuit (IC) based on the semiconductor device, and thereby constructing an electronic apparatus. Therefore, the present disclosure further provides an electronic apparatus including the semiconductor device described above. The electronic apparatus may further include components such as a display screen cooperating with the integrated circuit and a wireless transceiver cooperating with the integrated circuit. Such electronic apparatus may include a smart phone, a computer, a tablet computer (PC), a wearable smart apparatus, a mobile power supply, and so on.

According to the embodiments of the present disclosure, there is further provided a method of manufacturing a system on chip (SoC). The method of manufacturing the system on chip (SoC) may include the method of manufacturing the semiconductor device described above. Specifically, a plurality of devices may be integrated on the chip, at least some of which are manufactured according to the method of the present disclosure.

In the above description, technical details such as patterning and etching of each layer have not been described in detail. However, those skilled in the art should understand that various technical means may be used to form layers, regions, etc. of desired shapes. In addition, in order to form the same structure, those skilled in the art may also design a method that is not completely the same as the method described above. In addition, although the various embodiments are described above separately, this does not mean that the measures in the various embodiments may not be advantageously used in combination.

The embodiments of the present disclosure have been described above. However, these embodiments are for illustrative purposes only, and are not intended to limit the scope of the present disclosure. The scope of the present disclosure is defined by the appended claims and their equivalents. Without departing from the scope of the present disclosure, those skilled in the art may make various substitutions and modifications, and these substitutions and modifications should all fall within the scope of the present disclosure.

What is claimed is:

1. A semiconductor device, comprising:

a substrate;

an active region extending vertically on the substrate, wherein the active region comprises a first source/drain layer, a channel layer and a second source/drain layer that are sequentially stacked;

a gate stack formed around at least part of an outer peripheral sidewall of the channel layer, wherein the outer peripheral sidewall of the channel layer extends vertically, wherein a sidewall of the gate stack closest to the channel layer is aligned with the outer peripheral sidewall of the channel layer, so as to occupy a same range in a vertical direction;

wherein the gate stack comprises a gate dielectric layer and a gate conductor layer formed on the gate dielectric layer, and each of a part of the gate dielectric layer close to the channel layer and a part of the gate conductor layer close to the channel layer has a shape that gradually increases firstly and then gradually decreases in the vertical direction as getting close to a sidewall of the gate stack closest to the channel layer in a horizontal direction;

wherein as getting close to the channel layer in the horizontal direction, each of a top surface of the gate conductor layer and a bottom surface of the gate conductor layer has a shape that gradually increases firstly and then gradually decreases in the vertical direction, and in a position where the gate stack is in contact with the channel layer, the gate conductor layer is aligned with the channel layer in the vertical direction; and wherein the gate conductor layer comprises a hollow structure.

2. The semiconductor device of claim 1, wherein the part of the gate dielectric layer and the part of the gate conductor layer are located at an end portion of the gate stack close to the channel layer.

3. The semiconductor device of claim 1, wherein at least part of a surface of the gate stack extends substantially along a crystal plane direction of the channel layer.

4. The semiconductor device according to claim 1, wherein, the first source/drain layer comprises a first sub-layer and a second sub-layer formed around an outer periphery of the first sub-layer, the second source/drain layer comprises a third sub-layer and a fourth sub-layer formed around an outer periphery of the third sub-layer, and the first sub-layer, the channel layer and the third sub-layer are substantially center-aligned in a vertical direction.

5. The semiconductor device of claim 4, wherein an outer peripheral sidewall of the first sub-layer and an outer peripheral sidewall of the third sub-layer are recessed inwardly with respect to the outer peripheral sidewall of the channel layer, and an outer peripheral sidewall of the second sub-layer and an outer peripheral sidewall of the fourth sub-layer protrude outwardly with respect to the outer peripheral sidewall of the channel layer.

6. The semiconductor device of claim 5, wherein the outer peripheral sidewall of the first sub-layer and the outer peripheral sidewall of the third sub-layer are substantially aligned in the vertical direction.

7. The semiconductor device of claim 1, further comprising:

a spacer formed above the gate stack.

8. The semiconductor device of claim 1, wherein the gate conductor layer comprises a gap inside the part of the gate conductor layer.

9. A semiconductor device, comprising:

a substrate;

an active region extending vertically on the substrate, wherein the active region comprises a first source/drain layer, a channel layer and a second source/drain layer that are sequentially stacked;

a hard mask layer formed on a top of the active region, wherein the hard mask layer has an outer peripheral sidewall substantially aligned with an outer peripheral sidewall of the channel layer in a vertical direction; and a gate stack formed around at least part of the outer peripheral sidewall of the channel layer, wherein the outer peripheral sidewall of the channel layer extends vertically, a sidewall of the gate stack closest to the channel layer is aligned with the outer peripheral sidewall of the channel layer, so as to occupy a same range in the vertical direction;

wherein the gate stack comprises a gate dielectric layer and a gate conductor layer formed on the gate dielectric layer, and each of an end portion of the gate dielectric layer close to the channel layer and an end portion of the gate conductor layer close to the channel layer has a shape that gradually increases firstly and then gradually decreases in the vertical direction as getting close to a sidewall of the gate stack closest to the channel layer in a horizontal direction, wherein as getting close to the channel layer in the horizontal direction, each of a top surface of the gate conductor layer and a bottom surface of the gate conductor layer has a shape that gradually increases firstly and then gradually decreases in the vertical direction, and in a position where the gate stack is in contact with the channel layer, the gate conductor layer is aligned with the channel layer in the vertical direction; and wherein the gate conductor layer comprises a hollow structure.

10. The semiconductor device of claim 9, wherein, the first source/drain layer comprises a first sub-layer and a second sub-layer formed around an outer periphery of the first sub-layer, the second source/drain layer comprises a third sub-layer and a fourth sub-layer formed around an outer periphery of the third sub-layer, and the first sub-layer, the channel layer, the third sub-layer and the hard mask layer are substantially center-aligned in the vertical direction, an outer peripheral sidewall of the first sub-layer and an outer peripheral sidewall of the third sub-layer are recessed inwardly with respect to the outer peripheral sidewall of the hard mask layer, and an outer peripheral sidewall of the second sub-layer and an outer peripheral sidewall of the fourth sub-layer protrude outwardly with respect to the outer peripheral sidewall of the hard mask layer.

11. The semiconductor device of claim 9, further comprising:

a contact layer under the active region and connected with the first source/drain layer, wherein the contact layer extends beyond the outer peripheral sidewall of the hard mask layer.

12. The semiconductor device of claim 9, wherein the end portion of the gate stack close to the channel layer has a shape that first gradually increases and then gradually decreases as getting close to the channel layer.

13. The semiconductor device of claim 9, wherein at least part of a surface of the end portion of the gate stack close to the channel layer extends substantially along a crystal plane direction of the channel layer.

14. The semiconductor device of claim 12, wherein the gate conductor layer comprises a gap inside the end portion.

15. An electronic apparatus, comprising an integrated circuit formed at least partially by the semiconductor device of claim 1.

16. The electronic apparatus of claim 15, further comprising:

a display cooperating with the integrated circuit and a wireless transceiver cooperating with the integrated circuit.

17. The electronic apparatus of claim 15, wherein the electronic apparatus comprises a smart phone, a computer, a tablet computer, artificial intelligence, a wearable device, or a mobile power supply.

* * * * *